(12) United States Patent
Wendler

(10) Patent No.: US 12,425,025 B2
(45) Date of Patent: Sep. 23, 2025

(54) PROXIMITY SWITCH AND METHOD FOR OPERATING A PROXIMITY SWITCH

(71) Applicant: TURCK Holding GmbH, Halver (DE)

(72) Inventor: Torsten Wendler, Schwarzenberg (DE)

(73) Assignee: TURCK Holding GmbH, Halver (DE)

( * ) Notice: Subject to any disclaimer, the term of this patent is extended or adjusted under 35 U.S.C. 154(b) by 244 days.

(21) Appl. No.: 18/052,420

(22) Filed: Nov. 3, 2022

(65) Prior Publication Data

US 2023/0139738 A1 May 4, 2023

(30) Foreign Application Priority Data

Nov. 4, 2021 (DE) .......................... 102021128706.5

(51) Int. Cl.
*H03K 17/95* (2006.01)

(52) U.S. Cl.
CPC ....... *H03K 17/953* (2013.01); *H03K 2217/95* (2013.01)

(58) Field of Classification Search
CPC .......................... H03K 17/953; H03K 2217/95
See application file for complete search history.

(56) References Cited

U.S. PATENT DOCUMENTS

| | | | | |
|---|---|---|---|---|
| 4,958,159 A * | 9/1990 | Wyatt | ................... | H03M 1/822 341/152 |
| 8,432,169 B2 * | 4/2013 | Niwa | ................. | H03K 17/9502 324/686 |
| 2011/0057668 A1* | 3/2011 | Chen | ..................... | G01B 7/023 324/655 |

FOREIGN PATENT DOCUMENTS

| | | |
|---|---|---|
| DE | 4429314 B4 | 2/2005 |
| DE | 102005014492 A1 | 11/2005 |
| DE | 102005001692 A1 | 7/2006 |
| DE | 102006053023 A1 | 8/2007 |
| DE | 102015216651 A1 | 3/2017 |
| EP | 1564888 A2 | 8/2005 |
| JP | 3440566 B2 | 8/2003 |

OTHER PUBLICATIONS

German Search Report in DE Appl. No. 102021128706.5 mailed Sep. 19, 2022, 10 pages.
European Search Report in Appl. No. 22200453.3 mailed Mar. 7, 2023, 4 pages.

* cited by examiner

*Primary Examiner* — Daniel C Puentes
(74) *Attorney, Agent, or Firm* — Kowert, Hood, Munyon, Rankin & Goetzel, P.C.; Gentry C. McLean; Dean M. Munyon

(57) ABSTRACT

A proximity switch is disclosed. In an embodiment, the proximity switch has a defined detection range and includes an oscillator, an oscillator amplifier, a temperature sensor, a microprocessor and a storage medium. The oscillator generates an alternating magnetic field and changes its oscillation state as a result of a target entering the detection range. The oscillator amplifier is configured to be controllable in an open-loop and closed-loop manner and has at least one amplifier stage. In this embodiment, the at least one amplifier stage has a controllable temperature compensation circuit which is configured to influence the oscillation behaviour of the oscillator based on compensation values received as control data from the microprocessor and/or from the storage medium, depending on a temperature detected by the temperature sensor. The disclosed embodiments also encompass a method for operating a proximity switch with temperature compensation.

19 Claims, 6 Drawing Sheets

PROXIMITY SWITCH AND METHOD FOR OPERATING A PROXIMITY SWITCH

CROSS-REFERENCE TO RELATED APPLICATIONS

The present application claims priority under 35 U.S.C. § 119 to German patent application 10 2021 128 706.5, filed Nov. 4, 2021, the disclosure of which is incorporated by reference herein in its entirety.

TECHNICAL FIELD

This disclosure relates to a proximity switch and a method for operating a proximity switch.

DESCRIPTION OF RELATED ART

Proximity switches, in particular inductive proximity switches, are extensively known in the state of the art.

Inductive proximity switches are known in the state of the art, thus for example DE 44 29 314 B4 describes such a proximity switch in which an alternating magnetic field is generated in a coil, with the result that a metal object entering said field influences the oscillation state. The detected change in the oscillation state is evaluated by a circuit, wherein two sensor coils are arranged in the alternating field in a direct differential connection to detect the induced voltages. In the process, the differential voltage of the sensor coils becomes zero in the sensing zone. In the solution according to DE 44 29 314 B4, the wound coils are arranged in three planes or in three corridors. A disadvantage of this solution is that the wound coils have a tendency to age, with the result that the switching distance drifts over time. In particular, the maximum switching distance achievable using wound coils is highly limited. DE 10 2006 053 023 A1 shows an alternative embodiment. A disadvantage of these known solutions is that temperature influences lead to drift or hysteresis.

To compensate for the temperature influences, U.S. Pat. No. 8,432,169 B2 therefore proposes providing a current mirror circuit having equilibrium establishment via a trimmer, wherein temperature influences are subsequently taken into account and corrected in a data-based correction. This temperature compensation is highly error-prone and is thus disadvantageous in the case of sensitive detection situations or very high temperature fluctuations.

Furthermore, it is known from DE 10 2005 001692 A1 to use a controllable network and to control a transmission function of the controllable network by means of a transconductance amplifier and to control the transmission function of the controllable network depending on the measured temperature by varying the gain of the transconductance amplifier, with the result that temperature-induced variations in the oscillator are compensated for at least in part. Using a controllable differential amplifier as transconductance amplifier is proposed. The solutions are structurally very complex.

SUMMARY OF DISCLOSED EMBODIMENTS

An object of the disclosed embodiments is to propose an improved proximity switch and an associated method, with which the detection characteristic of a proximity switch in the case of temperature influences is improved.

According to the disclosed embodiments, this object is achieved by a proximity sensor and a method according to features described herein.

Accordingly, the object is achieved by a proximity switch which is formed in particular as an inductive proximity switch and has a defined detection range. The proximity switch comprises
  an oscillator, which generates an alternating magnetic field, in particular in a self-energized manner, and changes its oscillation state as a result of a target entering the detection range,
  at least one oscillator amplifier, and
  at least one temperature sensor provided for detecting the temperature of an element of the proximity switch, such as a surface temperature, and/or the ambient temperature, in particular for detecting the temperature of the oscillator amplifier and/or of a coil, wherein
  the oscillation amplifier is formed so as to be controllable in an open-loop and closed-loop manner and has at least one amplifier stage, ideally two amplifier stages.

Here, by coil is meant the transmission coil and/or at least one receiver coil of the oscillator.

Here, the oscillator can be controlled in an open-loop and/or closed-loop manner on the basis of the temperature determined by the temperature sensor, with the result that temperature-induced influences and variations in the oscillator properties can be compensated for at least in part or in full. Also comprised is a microprocessor, which is connected to a storage medium, for controlling the gain of the oscillator amplifier. Compensation data are or can be stored on the storage medium and can be electronically detected and processed by the microprocessor.

Here, compensation data or compensation values mean any temperature-dependent (digital or analogue) compensation and correction values, characteristic curves, algorithms and/or dependency data that describe a functional relationship between the proximity sensor, the oscillator, individual coils or components of the oscillator depending on the temperature and associated control data for compensation. The compensation data can be ascertained and/or supplemented in the laboratory or during ongoing operation of the proximity sensor.

At times, the terms "compensation data", "compensation values" and/or "control data" will be used synonymously herein.

The voltage and/or data transmission can be effected on the known systems such as Ethernet, Single Pair Ethernet (SPE), IO Link, PoDL or any other suitable communication technology and/or protocol.

For the temperature-dependent open-loop and/or closed-loop control, in the present case at least one amplifier stage of the oscillation amplifier has a controllable temperature compensation circuit which is formed to influence the oscillation behaviour of the oscillator, in particular to compensate for temperature influences and prevent hysteresis, on the basis of a data receipt (compensation value) from the microprocessor and/or from the storage medium and depending on the temperature ascertained by the temperature sensor.

Here, it is crucial that the oscillation behaviour of the oscillator is influenced directly via the control of the oscillation amplifier, in particular by controlled negative current feedback taking place.

The amplifier stages have suitable resistors for adjusting the operating point, and at least one resistor for the negative current feedback, for the thermal operating-point stabilization of the amplifier stage. This resistor has an influence in particular on the current flow through the transistor and hereby also an influence on the amplitude of the measurement signal. The temperature-dependent compensation of the circuit components takes place via the emitter branch by adjusting and controlling the earth-referenced resistance in a targeted manner.

In an improved embodiment variant, the temperature compensation circuit is arranged in an emitter branch of the at least one amplifier stage.

Advantageously, the oscillation amplifier has two amplifier stages, wherein the temperature compensation circuit is incorporated in at least one of them. Here, the emitter branch of the amplifier stage means in particular that no further current branch-off, circuit and/or functional element is provided thereafter upstream of the earthing or earth line.

In an advantageous embodiment, the oscillation amplifier has two amplifier stages, wherein the temperature compensation circuit is incorporated in the first amplifier stage.

The two amplifier stages are advantageously provided in order to be able to achieve the highest possible overall gain and to influence the phase position of the oscillator such that it can start to oscillate, because each of the transistor stages causes a 180° phase rotation.

Here, first amplifier stage means the amplifier stage in which the phase position undergoes the first 180° rotation as a result of the transistor, and the second amplifier stage means the amplifier stage in which the phase position undergoes a further 180° rotation, with the result that thereafter the phase has been rotated by 360° in relation to the starting position.

A further improvement can be that the oscillation amplifier has two amplifier stages, wherein one temperature compensation circuit is incorporated in each of the first amplifier stage and the second amplifier stage. These two temperature compensation circuits can be formed structurally different or also identical and ideally can be activated and deactivated. If the temperature compensation circuits are formed structurally different, it is advantageous if they are activated or deactivated depending on the detected temperature range.

For example, one temperature compensation circuit can be formed to operate more sensitively (more quickly, more precisely) in a low temperature range, with the result that it is activated in the corresponding temperature range. Analogously, the other temperature compensation circuit is formed for a high or higher temperature range and is activated for that purpose as needed.

For normal industrial applications, incorporation in the first amplifier stage is sufficient. For the use of the proximity switch in a wider temperature range of, for example, −40° C. to 100° C., a second temperature compensation circuit can be provided for better control, e.g. for sensors in the food industry or applications which are subject to extreme temperature fluctuations.

For example, the temperature sensor is a contact sensor which is secured to or on the surface of the oscillation amplifier and/or at least one amplifier stage. The temperature sensor is ideally a semiconductor sensor or an arrangement of one or more diodes or also a temperature-dependent resistor. In the normal scenario, this sensor is positioned between the coil and the oscillator amplifier in order to detect the temperature thereof.

In another alternative embodiment, the temperature compensation circuit comprises and/or substantially consists of a digital potentiometer, which is formed in particular as a controllable resistor and is formed in particular to receive digital control commands from the microcontroller. In this case, the temperature compensation circuit on the voltage branch can have a branch-off to earth, in which a resistor is arranged. This branch-off on the voltage side of the digital potentiometer stabilizes the digital potentiometer.

The resistor connected in parallel with the digital potentiometer is used so as to be able to adapt the change range of the temperature compensation circuit. In addition, this makes it possible to configure the change in the compensation value to be more sensitive.

In a second alternative embodiment of the proximity switch, the temperature compensation circuit has an operational amplifier, which in particular is a voltage follower, which is also used to decouple the microprocessor from the oscillation amplifier. In this case, the temperature compensation circuit is formed to receive a pulse-width modulation (PWM) as compensation value. As an improvement, a resistor and/or an earthed, branching-off line branch, in which a capacitor is also arranged, can be provided in the control line, the RC path to the operational amplifier.

The PWM resolution represents a measure for the sensitivity of the control and can advantageously lie in the range of an 8-bit to 32-bit resolution. In addition, a low-pass filter can advantageously be provided, consisting for example of a capacitor and a resistor, which converts the PWM signal into an equivalent DC voltage.

In a third alternative embodiment of the proximity switch, the temperature compensation circuit has an operational amplifier, wherein the temperature compensation circuit is formed to receive and process an analogue value as compensation values. Advantageously, a digital-to-analogue converter can be arranged in the control line, the path to the operational amplifier. The operational amplifier acts as a voltage follower and serves to decouple the microprocessor from the oscillation amplifier.

In the process, the quantization of the digital-to-analogue converter determines the sensitivity of the temperature control, wherein 8-bit to 32-bit is generally sufficient.

The disclosed embodiments also encompass a method for operating a proximity switch, in particular an inductive proximity switch, with an oscillator, for detecting a target, wherein the oscillator contains at least one oscillator amplifier. In this case:
  the oscillator generates an alternating magnetic field, which changes its oscillation state because of a target entering its detection range,
  the temperature of an element of the proximity sensor and/or the ambient temperature is/are detected at least intermittently by means of at least one temperature sensor,
  the measured values, and/or data derived therefrom, of the temperature sensor are sent to a microprocessor and/or to a storage medium connected thereto, wherein temperature algorithms and/or temperature-dependency data are stored on the storage medium. Here, on the basis of the temperature determined by the at least one temperature probe and the temperature algorithms and/or temperature-dependency data stored on the storage medium, the microprocessor ascertains control data and sends it to at least one temperature compensation circuit of the oscillation amplifier, with the result that temperature-induced influences on the behaviour of the oscillator are compensated for at least in part, ideally are compensated for in full.

In an improved method, the proximity switch is formed according to one of the aforementioned embodiments.

A further improvement of the method is that the temperature sensor detects the temperature of the coil and of the oscillation amplifier or of at least one amplifier stage of the oscillation amplifier, wherein by "coil" is meant the transmission coil and/or at least one receiver coil of the oscillator the individual or joint temperature of which is detected.

The method can additionally be improved if the microprocessor sends the control data to the temperature compensation circuit of the operational amplifier and/or of the at least one amplifier stage the temperature of which has been detected by the temperature sensor.

BRIEF DESCRIPTION OF THE DRAWINGS

Further details and advantages of the disclosed embodiments will now be explained in more detail on the basis of example embodiments represented in the drawings. There are shown in.

DETAILED DESCRIPTION

Figure 1:
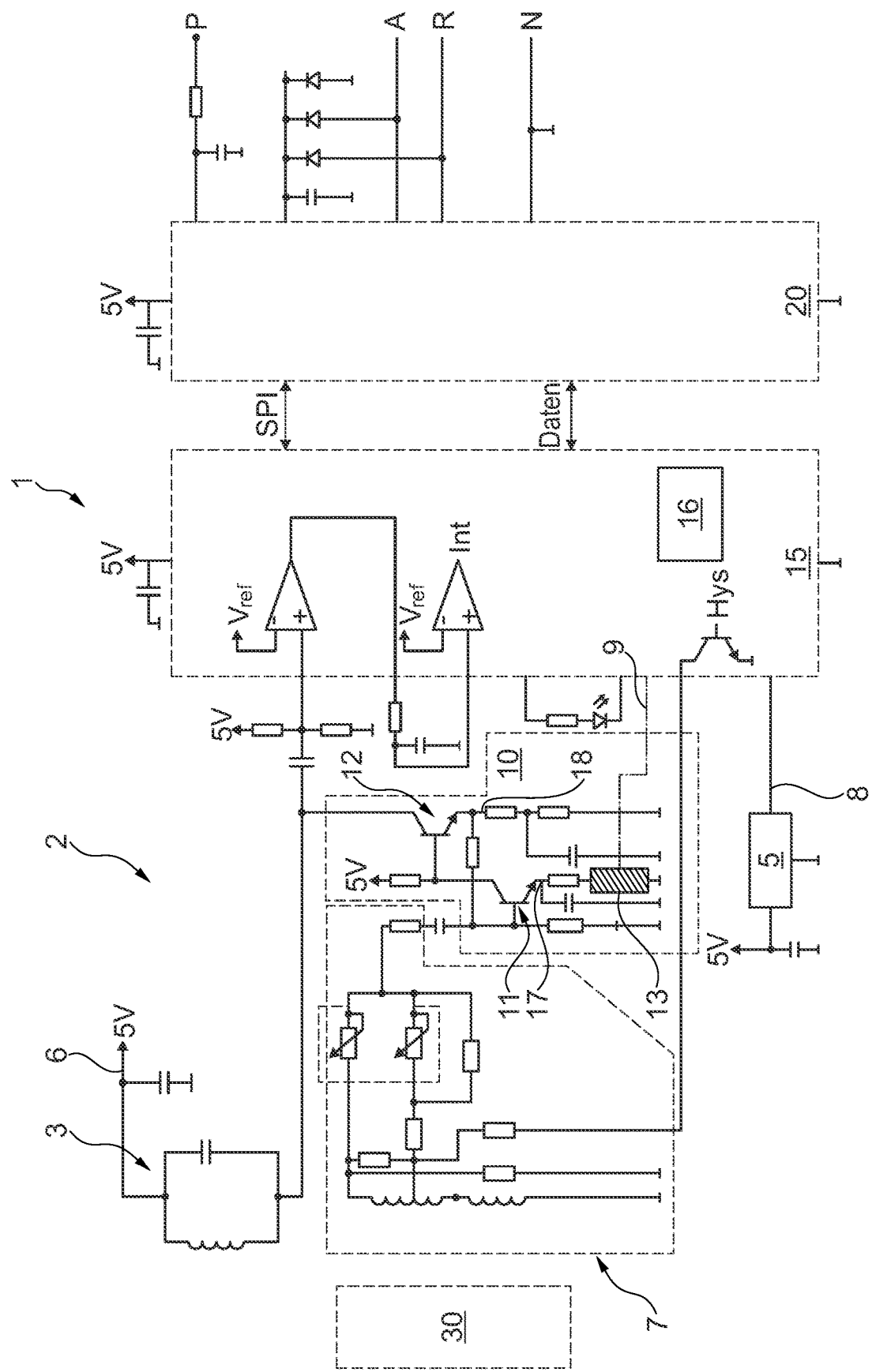
FIG. 1 is a circuit diagram illustrating the proximity switch according to an embodiment.

FIG. 1 shows a circuitry or a circuit diagram for the proximity switch 1 according to the disclosed embodiments. The oscillator 2 or transmission coil 3 is connected via the line 6 to a voltage source via the line 6. In the present case, the transmission coil 3 interacts in a known manner with receiver coils 7. The construction and mode of operation thereof will not be explained further in the present case, in particular not the usual electronic elements for balancing the switching distance.

The oscillator 2 comprises an oscillation amplifier 10, which comprises a first amplifier stage 11 and a second amplifier stage 12. In addition, the circuitry of the proximity switch 1 has a, schematically represented, microprocessor 15, which is connected to an output driver 20 at least in a data-carrying manner, preferably is connected in a data- and current-carrying manner via a current-modulated line.

A temperature compensation circuit 13, which is described in more detail in FIGS. 2 to 6 below, is provided in the emitter branch 17 of the first amplifier stage 11. The emitter branch 18 of the second amplifier stage 12 is formed without a temperature compensation circuit. The other (micro-)electronic components can be identified by their respective symbols and are not described in more detail.

In the lower region of FIG. 1, a temperature sensor 5 is also represented, which is connected to the microprocessor 15 via the line 8 and is also independently connected to a voltage source. In the microprocessor 15, the measured values received from the temperature sensor 5 are detected, evaluated and compared with the compensation values, temperature algorithms and/or temperature-dependency data stored in the storage medium 16. The microprocessor 15 then sends control data to the temperature compensation circuit 13 via the control line 9.

Figure 2:
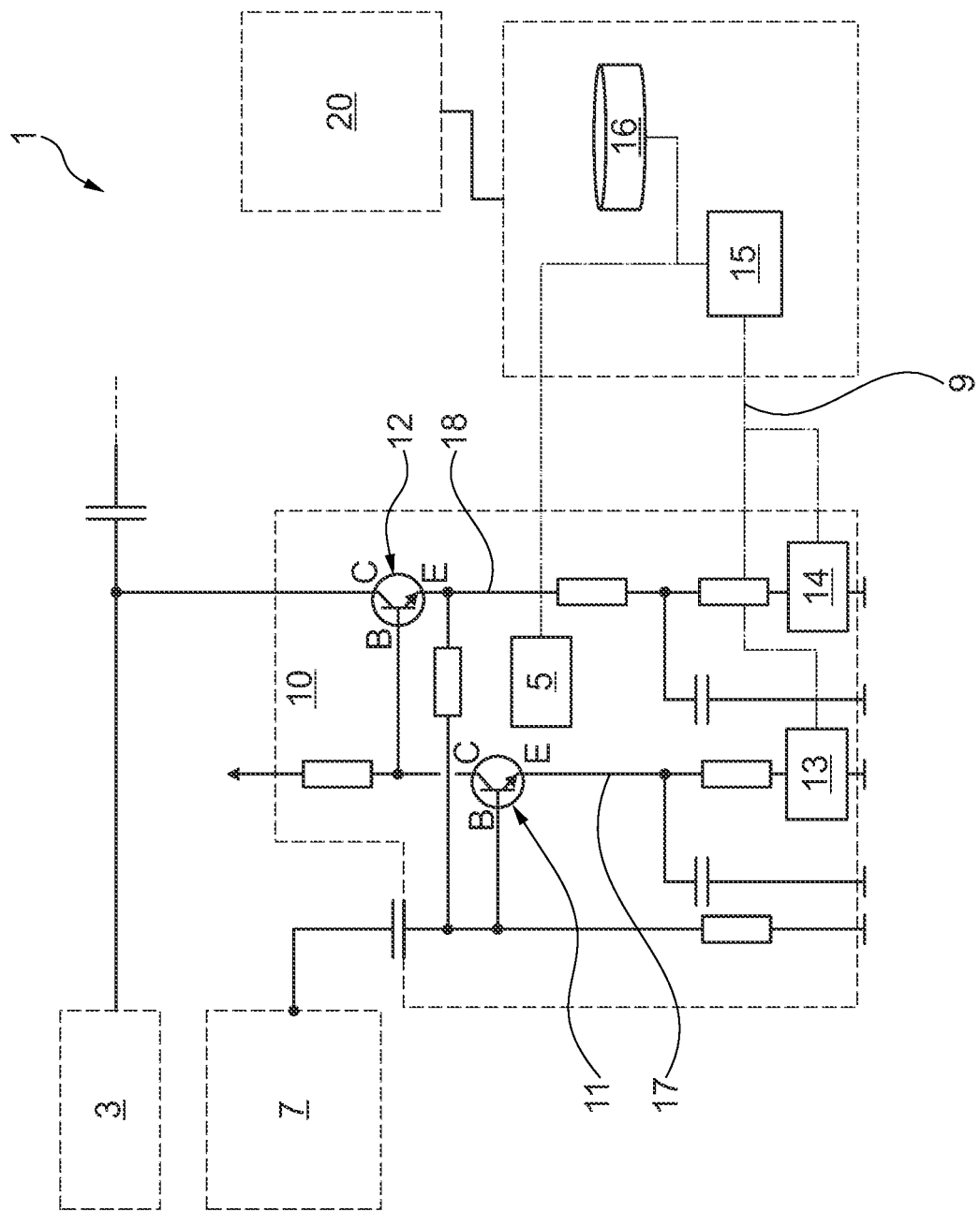
FIG. 2 illustrates certain elements of the circuit diagram according to FIG. 1 for an alternative embodiment of the proximity switch.

In the embodiment according to FIG. 2, the circuit according to FIG. 1 is represented in simplified form, and identical reference numbers have the same meaning and therefore in some cases are not named and/or explained again. In the example shown, the oscillation amplifier 10 has the temperature compensation circuit 13 in the first amplifier stage 11. In addition, a temperature compensation circuit 14 is also arranged in the second amplifier stage 12 in the emitter branch of the second amplifier stage 12.

In the present case, these temperature compensation circuits 13, 14 are structurally identical and formed in accordance with an embodiment according to FIGS. 3 to 6. The two temperature compensation circuits 13, 14 receive the control data for compensating for the temperature influences from the microprocessor 15 or from the storage medium 16. The control data are supplied to the two temperature compensation circuits 13, 14 via the control lines 9.

Figure 3:
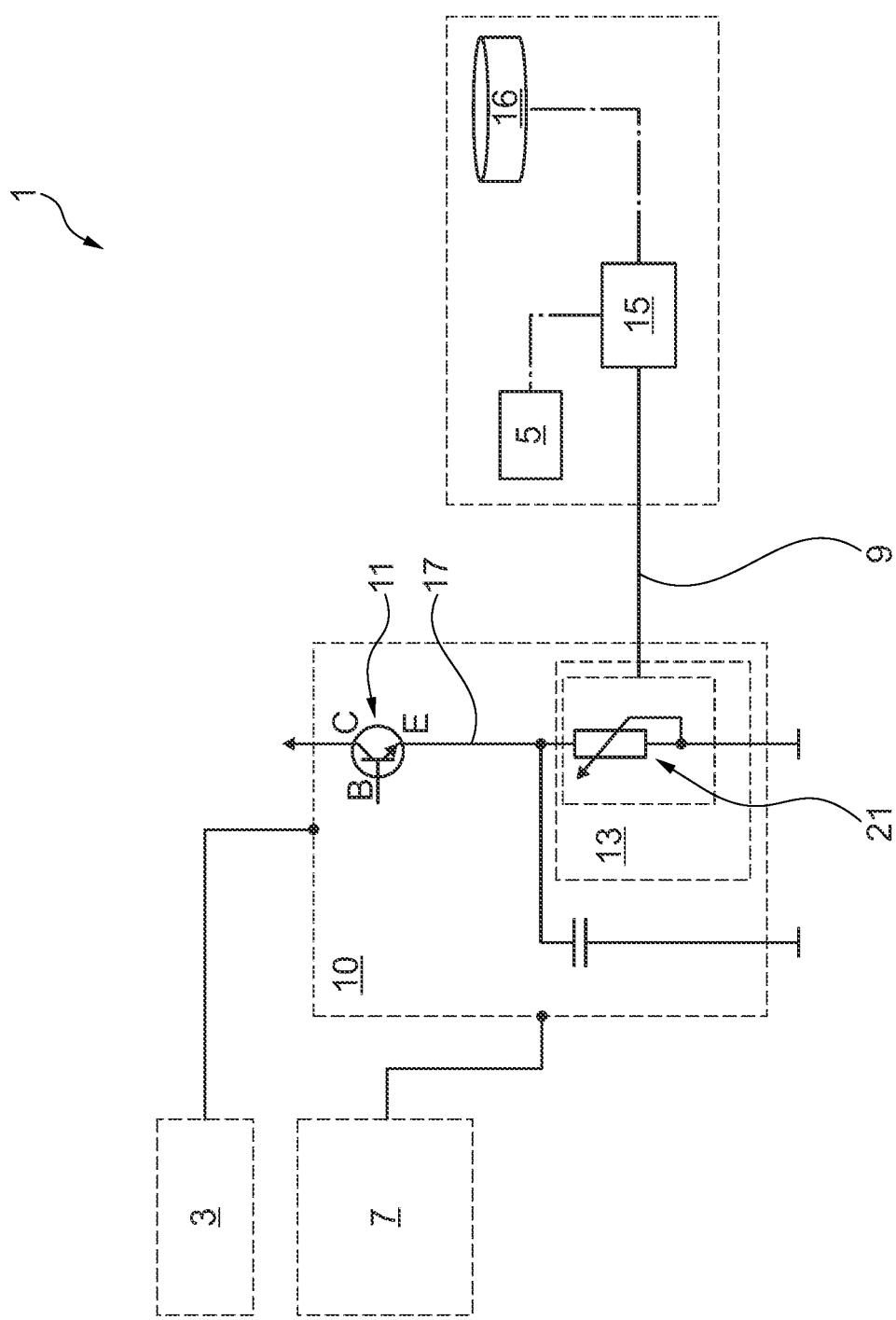
FIG. 3 is a circuit diagram illustrating a first embodiment of a temperature compensation circuit.
Figure 4:
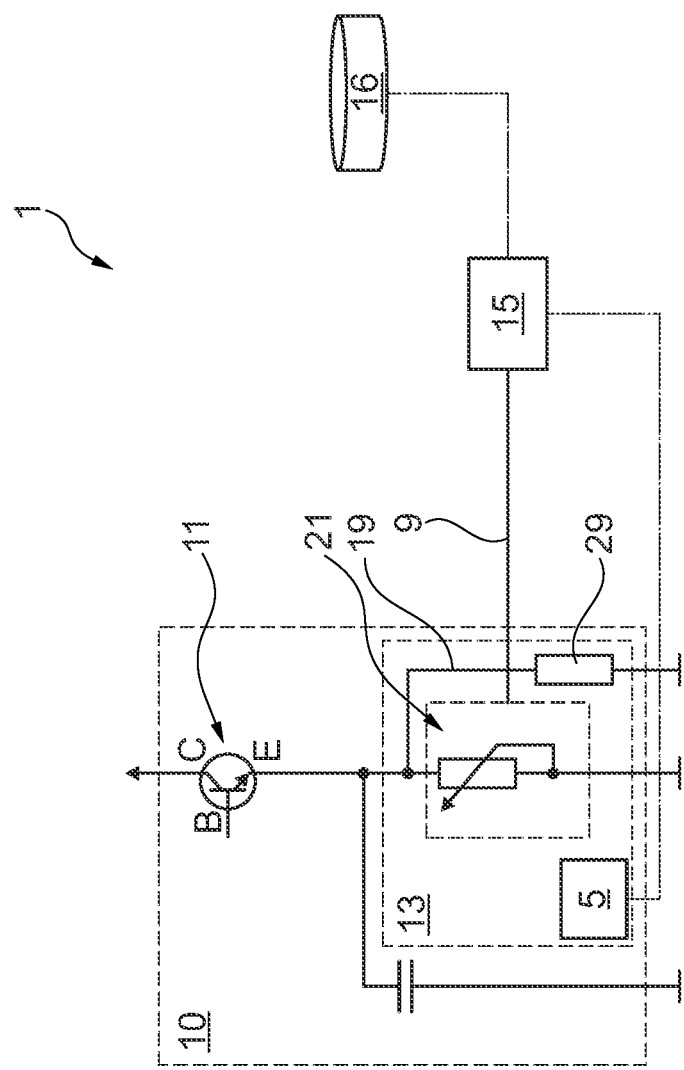
FIG. 4 is a circuit diagram illustrating a second embodiment of a temperature compensation circuit as an improvement of the design according to FIG. 3.
Figure 5:
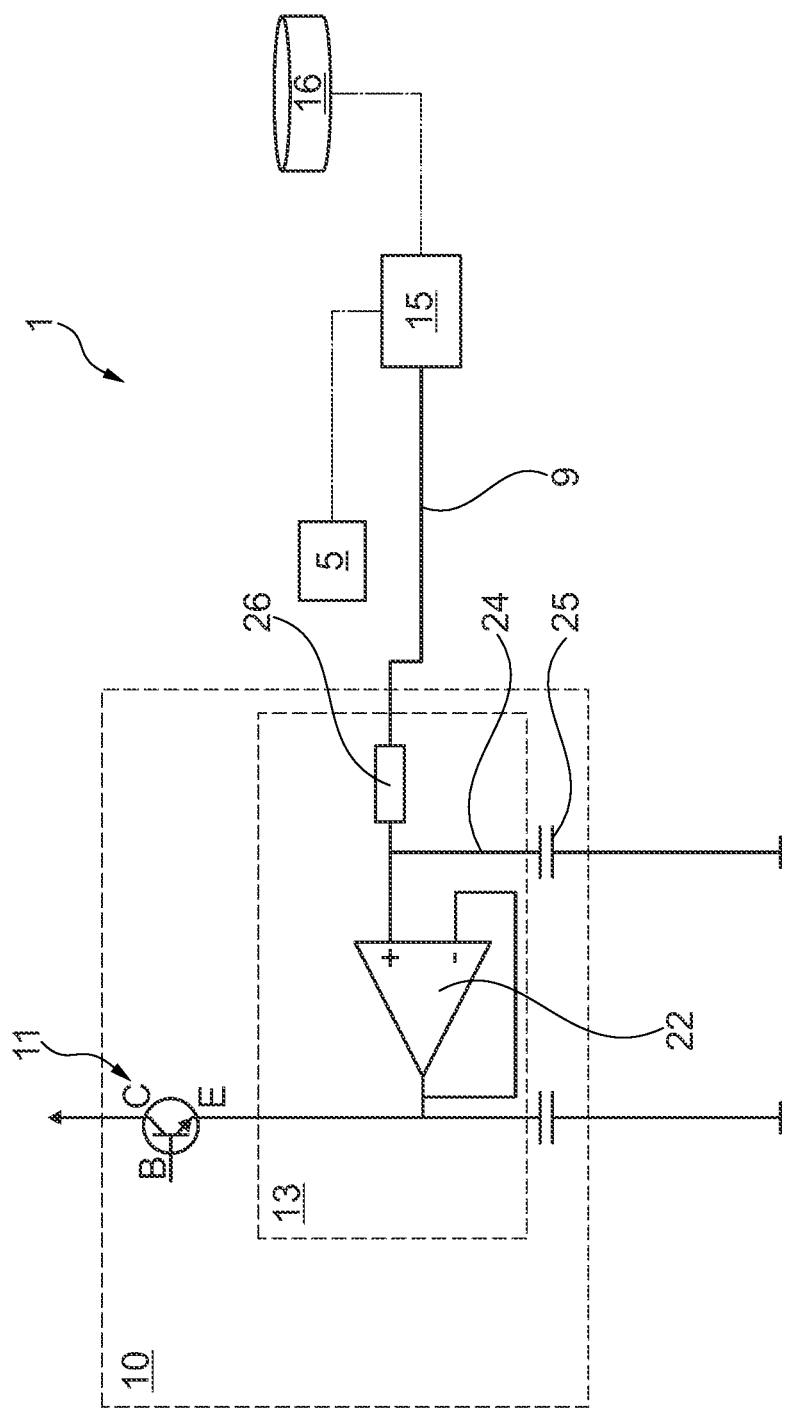
FIG. 5 is a circuit diagram illustrating a third embodiment of a temperature compensation circuit.
Figure 6:
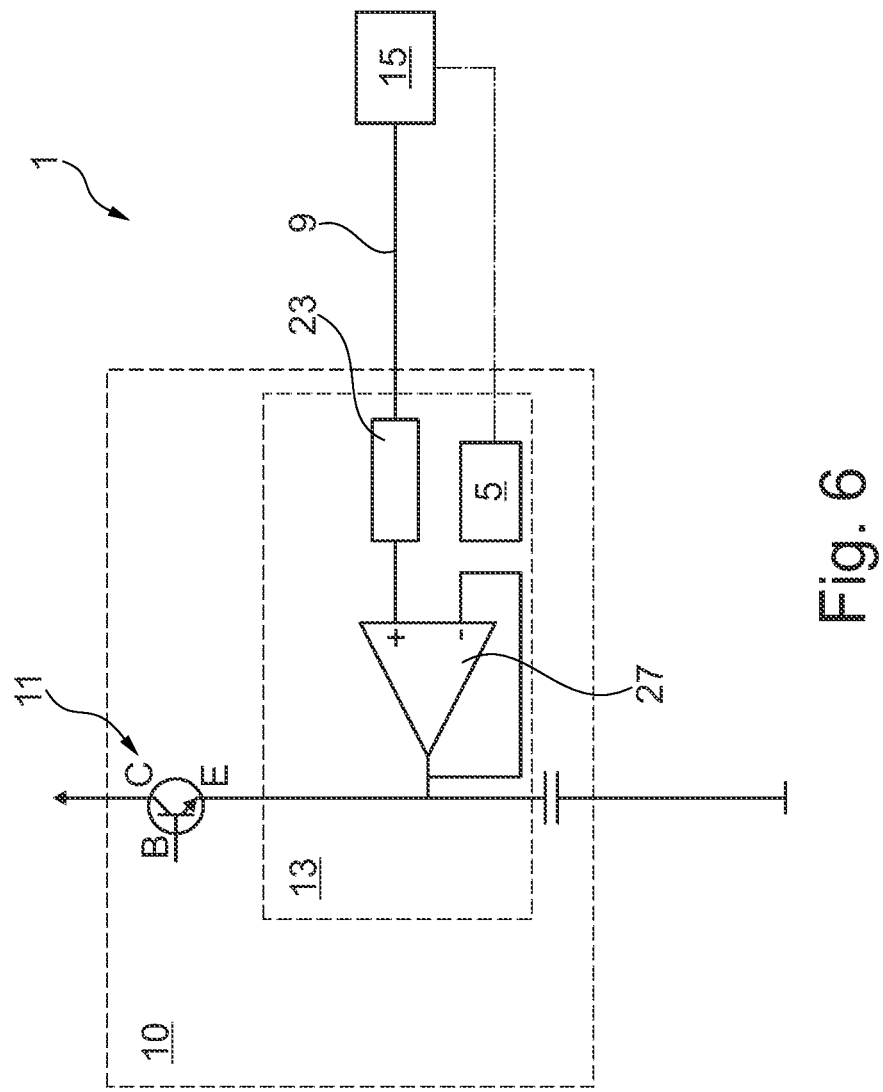
FIG. 6 is a circuit diagram illustrating a fourth embodiment of a temperature compensation circuit.

In each case in the embodiment example according to FIG. 3 and in the further FIGS. 4 to 6, only the first amplifier stage 11 and the temperature compensation circuit 13 arranged in the emitter branch 17 is, wherein comparable or identical elements and/or circuits of the temperature compensation circuit can also be provided in each case in the second amplifier stage 12 and/or in the two emitter branches 17, 18. Compared with FIGS. 1 and 2, the circuit is represented in an even more simplified form. The first embodiment of the temperature compensation circuit 13, shown in FIG. 3, is formed as a digital potentiometer 21. For example, a resistor that can be controlled in a stepless manner (rheostat) and/or another switchable micro-electronic component form(s) the core piece in this case.

In the second embodiment of the temperature compensation circuit 13 according to FIG. 4, a digital potentiometer 21 is provided, analogously to FIG. 3, wherein an earthed line branch 19, in parallel therewith, with a resistor 29 is additionally arranged for adjusting the sensitivity of the digital potentiometer 21.

FIG. 5 shows a third embodiment of the temperature compensation circuit 13, in which an operational amplifier 22 is comprised as a voltage follower and for decoupling the microprocessor 15 from the oscillator amplifier 10. In this case, the operational amplifier 22 is formed to receive a pulse-width modulation (PWM value) as the control data and/or compensation values via the control line 9, the RC path.

For the purpose of attenuation and signal smoothing, a resistor 26 can be arranged in the control line 9, as also shown in the example according to FIG. 5, and a line branch-off 24 in which a capacitor 25 is arranged can be arranged between the resistor 9 and the operational amplifier 22. Together with the resistor 26, the capacitor 25 forms a low-pass filter which converts the PWM signal into an equivalent DC voltage.

The PWM resolution represents a measure for the sensitivity of the control and is at a 12-bit resolution in the example shown.

Lastly, FIG. 6 shows the fourth embodiment of the temperature compensation circuit 13, in which, analogously to the embodiment according to FIG. 5, an operational amplifier 27 is provided as a voltage follower and for decoupling the microprocessor 15 from the oscillator amplifier 10. The latter is formed to receive and process analogue values as control data or compensation values. In the example shown, digital control data are sent to the operational amplifier 27 via the control line 9, the RC path, by the microprocessor 15, with the result that a digital-to-analogue converter 23 is arranged in the control line 9. The digitalto-analogue converter 23 can also be arranged upstream of the microprocessor 15 or interact with the storage medium independently and prepare the storage data in a suitable way for the microprocessor 15 and/or the operational amplifier 27.

In this embodiment variant, the quantization of the digital-to-analogue converter determines the sensitiveness of the temperature control, wherein a 12-bit resolution has also been effected in this example. The advantage of using digital-to-analogue converters is that they are already contained in many microprocessors. Furthermore, compared with the variant shown in FIG. 5, no low-pass filter is required, which reduces component costs.

It is immediately apparent to a person skilled in the art that the above embodiments have been described independently as subject matters but can be combined in parts according to requirements.

LIST OF REFERENCE NUMBERS

1 Proximity switch
2 Oscillator
3 Transmission coil
5 Temperature sensor
6 Line
7 Receiver coils
8 Line
9 Control line, RC path
10 Oscillator amplifier
11 Amplifier stage
12 Amplifier stage
13 Temperature compensation circuit
14 Temperature compensation circuit
15 Microprocessor
16 Storage medium
17 Emitter branch
18 Emitter branch
19 Line branch
20 Output driver
21 Digital potentiometer
22 Operational amplifier
23 Digital-to-analogue converter (DAC)
24 Line branch
25 Capacitor
26 Resistor
27 Operational amplifier
28 . . .
29 Resistor
30 Detection range

What is claimed is:

1. A proximity switch having a defined detection range, the proximity switch comprising:
an oscillator configured to generate an alternating magnetic field and change its oscillation state as a result of a target entering the detection range, wherein the oscillator comprises at least one oscillator amplifier;
at least one temperature sensor configured to detect a temperature of an element of the proximity switch or an ambient temperature, wherein
the oscillator amplifier is configured to be controllable in an open-loop and closed-loop manner and has at least one amplifier stage, and
the oscillator is controllable based on the temperature detected by the temperature sensor;
at least one microprocessor configured to control a gain of the oscillator amplifier; and
at least one storage medium coupled to the microprocessor and configured to store compensation data, wherein
the at least one amplifier stage of the oscillation amplifier includes a controllable temperature compensation circuit configured to influence an oscillation behavior of the oscillator based on compensation values, as control data, from the microprocessor or from the storage medium, depending on the temperature detected by the temperature sensor, and
the temperature compensation circuit includes a digital potentiometer controlled using the compensation values, and the microprocessor is configured to receive the temperature detected by the temperature sensor, generate the control data based on the temperature and the compensation data, and forward the control data to the digital potentiometer.

2. The proximity switch according to claim 1, wherein the temperature compensation circuit is arranged in an emitter branch of the at least one amplifier stage.

3. The proximity switch according to claim 1, wherein the oscillator amplifier has two amplifier stages.

4. The proximity switch according to claim 3, wherein the temperature compensation circuit is incorporated in a first amplifier stage of the two amplifier stages.

5. The proximity switch according to claim 4, wherein one temperature compensation circuit is incorporated in each of the first amplifier stage and a second amplifier stage of the two amplifier stages.

6. A method for operating a proximity switch comprising an oscillator including at least one oscillator amplifier, the method comprising:
generating, by the oscillator, an alternating magnetic field which changes its oscillation state because of a target entering a detection range for the proximity switch;
detecting, by a temperature sensor, a temperature of an element of the proximity switch or an ambient temperature;
sending data associated with measured values from the temperature sensor to a microprocessor or to a storage medium coupled to the microprocessor, wherein compensation data is stored on the storage medium;
generating, by the microprocessor, control data, wherein the generating is based on the temperature detected by the temperature sensor and the compensation data stored on the storage medium; and
sending, by the microprocessor, the control data to at least one temperature compensation circuit within an amplifier stage of the at least one oscillator amplifier, wherein the temperature compensation circuit comprises at least one of a digital potentiometer controlled using the control data or an operational amplifier configured as a voltage follower.

7. The method according to claim 6, wherein the temperature sensor detects the temperature of the at least one oscillator amplifier.

8. The method according to claim 6, wherein the temperature sensor detects the temperature of the amplifier stage.

9. The method according to claim 6, wherein the temperature sensor detects the temperature of at least one coil within the proximity switch.

10. The method according to claim 6, wherein sending the control data includes sending the compensation data.

11. The method according to claim 6, wherein the detecting is performed at least intermittently.

12. The method according to claim 6, wherein the oscillator amplifier includes two amplifier stages.

13. The method according to claim 12, wherein the temperature compensation circuit is coupled within a first amplifier stage of the two amplifier stages.

14. The method according to claim 13, wherein one temperature compensation circuit is coupled within each of the first amplifier stage and a second amplifier stage of the two amplifier stages.

15. A proximity switch having a defined detection range, the proximity switch comprising:
   an oscillator configured to generate an alternating magnetic field and change its oscillation state as a result of a target entering the detection range, wherein the oscillator comprises at least one oscillator amplifier;
   at least one temperature sensor configured to detect a temperature of an element of the proximity switch or an ambient temperature, wherein
      the oscillator amplifier is configured to be controllable in an open-loop and closed-loop manner and has at least one amplifier stage, and
      the oscillator is controllable based on the temperature detected by the temperature sensor;
   at least one microprocessor configured to control a gain of the oscillator amplifier; and
   at least one storage medium coupled to the microprocessor and configured to store compensation data, wherein
      the at least one amplifier stage of the oscillation amplifier includes a controllable temperature compensation circuit configured to influence an oscillation behavior of the oscillator based on compensation values, as control data, from the microprocessor or from the storage medium, depending on the temperature detected by the temperature sensor, and
   the temperature compensation circuit comprises an operational amplifier configured as a voltage follower and for decoupling the microprocessor from the oscillator amplifier, and
   the microprocessor is configured to receive the temperature detected by the temperature sensor, generate the control data based on the temperature and the compensation data, and forward the control data to the temperature compensation circuit.

16. The proximity switch according to claim 15, wherein the operational amplifier is formed to receive a pulse-width modulation (PWM) value as a compensation value, and wherein a control line for the operational amplifier includes a resistor and a capacitor.

17. The proximity switch according to claim 15, wherein the operational amplifier is formed to receive and process an analog value as a compensation value, and wherein a control line for the operational amplifier includes a digital-to-analog converter.

18. The proximity switch according to claim 15, wherein the temperature sensor is configured to detect a temperature of the oscillator amplifier.

19. The proximity switch according to claim 15, wherein the proximity switch is an inductive proximity switch and the temperature sensor is configured to detect a temperature of a coil of the proximity switch.

* * * * *